United States Patent
Park et al.

(10) Patent No.: US 9,506,637 B2
(45) Date of Patent: Nov. 29, 2016

(54) CIRCUIT BOARD AND LIGHTING DEVICE HAVING THE CIRCUIT BOARD

(71) Applicant: LG INNOTEK CO., LTD., Seoul (KR)

(72) Inventors: Hyun Gyu Park, Seoul (KR); Min Jae Kim, Seoul (KR); Se Woong Na, Seoul (KR); In Hee Cho, Seoul (KR); Man Hue Choi, Seoul (KR); Seung Kwon Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 134 days.

(21) Appl. No.: 14/472,075

(22) Filed: Aug. 28, 2014

(65) Prior Publication Data

US 2015/0092446 A1  Apr. 2, 2015

(30) Foreign Application Priority Data

Oct. 2, 2013  (KR) .................. 10-2013-0118104

(51) Int. Cl.
| | |
|---|---|
| *F21V 7/04* | (2006.01) |
| *F21V 21/14* | (2006.01) |
| *F21V 8/00* | (2006.01) |
| *H05K 1/02* | (2006.01) |
| *H05K 3/00* | (2006.01) |

(51) Int. Cl.
| | |
|---|---|
| *H05K 1/05* | (2006.01) |
| *G02F 1/1335* | (2006.01) |

(52) U.S. Cl.
CPC ............. *F21V 21/14* (2013.01); *G02B 6/0068* (2013.01); *G02B 6/0091* (2013.01); *H05K 1/0278* (2013.01); *G02F 1/133615* (2013.01); *H05K 1/028* (2013.01); *H05K 1/056* (2013.01); *H05K 3/0061* (2013.01); *H05K 2201/0394* (2013.01); *H05K 2201/09054* (2013.01); *H05K 2201/09063* (2013.01); *H05K 2201/10106* (2013.01); *H05K 2203/0195* (2013.01); *H05K 2203/302* (2013.01)

(58) Field of Classification Search
CPC ... F21V 21/14; G02B 6/0068; G02B 6/0073; G02B 6/0091; G02F 1/133615; H05K 1/0277; H05K 1/0278; H05K 1/028; H05K 1/0281; H05K 2201/09054; H05K 2201/09063; H05K 2201/10106
USPC .................. 362/612, 630–631; 361/749–751
See application file for complete search history.

(56) References Cited

U.S. PATENT DOCUMENTS 7,458,709 B2 * 12/2008 Lang .................... G02B 6/0046
349/152
8,071,882 B2 * 12/2011 Okajima .............. H05K 1/0203
174/250

FOREIGN PATENT DOCUMENTS

| EP | 2739127 A2 | 6/2014 |
|---|---|---|
| WO | WO-2013/073861 A1 | 5/2013 |

OTHER PUBLICATIONS

Extended European Search Report dated Mar. 11, 2015 in European Application No. 14170697.8.

*Primary Examiner* — Jason Moon Han
(74) *Attorney, Agent, or Firm* — Saliwanchik, Lloyd & Eisenschenk

(57) ABSTRACT

Provided is a circuit board including: a support substrate including a first region and a second region extending to be bent from the first region; light emitting devices mounted to the first region of the support substrate; and a bending portion bent between the first region and the second region, wherein the bending portion comprises: an interconnection line arrangement portion that crosses an interconnection line; and an interconnection line protection portion disposed on the periphery of the interconnection line, wherein the interconnection line protection portion protrudes more than the interconnection line arrangement portion.

13 Claims, 8 Drawing Sheets

CIRCUIT BOARD AND LIGHTING DEVICE HAVING THE CIRCUIT BOARD

CROSS-REFERENCE TO RELATED APPLICATION

This application claims the benefit under 35 U.S.C. §119 of Korean Patent Application No. 10-2013-0118104, filed Oct. 2, 2013, which is hereby incorporated by reference in its entirety.

BACKGROUND

1. Field of the Invention

Embodiments of the present invention relate to a circuit board and a lighting device having the circuit board.

2. Description of the Related Arts

A liquid crystal display (LCD) has no self-luminous which can make its own light, a separate lighting device is needed for all the liquid crystal display devices. Such a lighting device serves as a light source of the liquid crystal display device, and a backlight unit (BLU) refers to a complex composed of a light source itself for irradiating light to a rear surface of a liquid module, a power circuit for driving the light source, and all components for enabling uniform flat light to be formed.

The liquid crystal display device becomes gradually thin, and accordingly, a reduction in a bezel width of the liquid crystal display device has been needed. As one example, in order to reduce the bezel width, the structure of a circuit board on which light emitting devices are mounted, or the structure of a lighting device including a light guide plate for guiding light generated from the light emitting devices has been changed.

However, as the structure of the circuit board becomes thin, it is problematic in that interconnection lines in a bending portion are damaged when a bending type circuit board is formed. Accordingly, ways to change the structure of the circuit board to be thinner while preventing the wirings of the circuit board from being damaged have been practically needed.

BRIEF SUMMARY

An aspect of embodiments of the present invention may provide a circuit board which enables interconnection lines connected to light emitting devices to be prevented from being damaged by including an interconnection line arrangement portion crossing at right angles to the interconnection line for transmitting electrical signals to the light emitting device and an interconnection line protection portion arranged on the periphery of the interconnection lines, and forming the interconnection line protection portion to protrude more than the interconnection line arrangement portion.

Another aspect of embodiments of the present invention may provide a circuit board which enables interconnection lines to be prevented from being damaged by forming a bending hole having an intaglio structure in an interconnection line arrangement portion.

A further aspect of embodiments of the present invention may provide a circuit board in which an interconnection line protection portion is configured in an embossed structure so that impact can be absorbed and relieved upon bending.

Yet another aspect of embodiments of the present invention may provide a circuit board which is configured such that an interconnection line arrangement portion having an intaglio structure is configured to include at least two edges at the bottom thereof or is formed in a curved line, or an interconnection line protection portion is formed to have a stepped structure by forming a groove, and a support substrate may be formed in various shapes so that interconnection lines can be prevented from being damaged in advance.

Still another aspect of embodiments of the present invention may provide a circuit board which is configured such that a dummy metal is attached to an insulating substrate of a support substrate via an adhesive layer, and a bending portion is formed in the dummy metal, so an interconnection line protection portion may be formed by freely disposing the dummy meal at a position where the interconnection lines are needed, thereby enabling the interconnection lines to be protected more effectively.

Still further another aspect of embodiments of the present invention may provide a lighting device which is configured such that a circuit board is configured such that a support substrate of a line region in which interconnection lines is included has a stepped structure so that the interconnection lines of the circuit board can be prevented from being damaged, and a structure of the circuit board can be changed to be thinner, and accordingly, when the circuit board is applied to a display device, a bezel width of the display device can be reduced.

According to an aspect of the embodiments of the present invention, a circuit board may include: a support substrate including a first region and a second region extending to be bent from the first region; a light emitting device mounted to the first region of the support substrate; and a bending portion bent between the first region and the second region, wherein the bending portion includes: an interconnection line arrangement portion which crosses interconnection lines; and an interconnection line protection portion arranged on the periphery of the interconnection lines, wherein the interconnection lines protection portion is configured to protrude more than the interconnection line arrangement portion.

The circuit board may further include an insulating substrate formed on the support substrate, wherein the interconnection line protection portion may be configured to protrude to an upper part of the insulating substrate.

The circuit board may further include an insulating substrate formed on the support substrate, wherein the interconnection line protection portion may be formed on the support substrate to come into contact with the insulating substrate, and the interconnection line arrangement portion may be configured to be spaced apart from the insulating substrate.

The interconnection line protection portion may include at least two or more edges.

The circuit board may further include an insulating substrate, wherein the insulating substrate may be formed at a protruding upper part of the interconnection line protection portion.

The circuit board may further include an insulating substrate formed on the support substrate, wherein the interconnection line protection portion may be formed by attaching a dummy metal to the insulating substrate via an adhesive layer.

The interconnection line protection portion may be configured to have a curved-shaped surface.

The interconnection line protection portion may be configured to have a plurality of stepped projections.

The interconnection line arrangement portion may be composed of a bending hole.

The bending hole may be formed to pass through the support substrate on the bending portion.

The circuit board may further include an insulating substrate formed on the support substrate, wherein the interconnection line may be formed on one surface of the insulating substrate, and the bending hole may be in the support substrate on another surface of the insulating substrate.

A cross section of the bending hole may include at least two or more edges at the bottom of the cross section.

The cross section of the bending hole may be formed in a curved line.

A lighting device may include a circuit board and a light guide plate disposed to be spaced apart from the circuit board.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
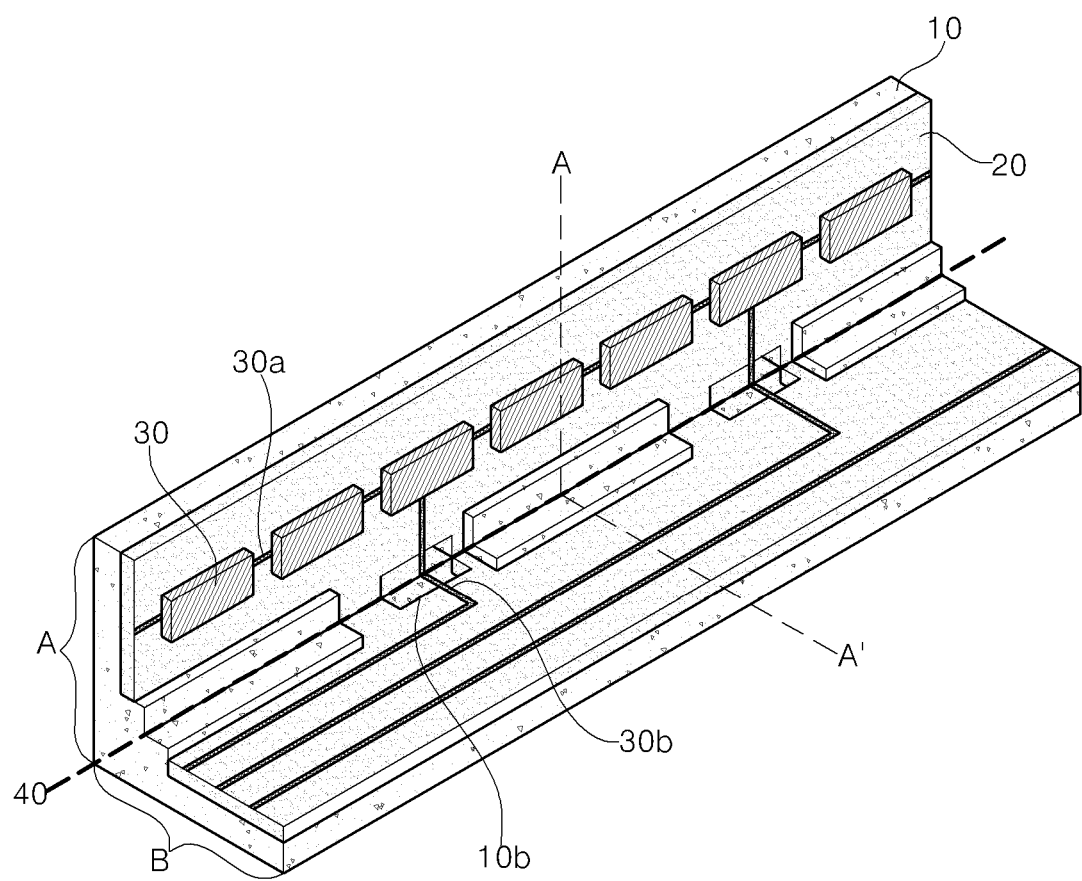
FIG. 1 is a view illustrating a circuit board according to an embodiment of the present invention.

Hereinafter, the configurations and operations according to embodiments of the present invention will be described in detail with reference to the accompanying drawings. The present invention may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

FIG. 1 is a view illustrating a circuit board according to an embodiment of the present invention.

Referring to FIG. 1, the circuit board includes: a support substrate 10 having a first region A and a second region B extending to be bent from the first region A; a light emitting device 30 mounted to the first region A of the support substrate 10; and a bending portion 40 bent between the first region A and the second region B.

The bending portion 40 is configured to include an interconnection line arrangement portion 10b which crosses an interconnection line 30b; and an interconnection line protection portion 10a arranged on the periphery of the interconnection line 30b, wherein the interconnection line protection portion 10a protrudes more than the interconnection line arrangement portion 10b.

More specifically, an insulating substrate 20 may be formed on the support substrate 10, the interconnection line protection portion 10a may be configured to protrude to an upper part of the insulating substrate 20.

Alternatively, the interconnection line protection portion 10a may be formed on the support substrate 10 to come into contact with the insulating substrate 20, and the interconnection line arrangement portion 10b may be configured to be spaced apart from the insulating substrate 10.

In a conventional art, a structure of the circuit board is configured to be thin for a reduction in a bezel width of a display device, and thus it is problematic in that interconnection lines formed in the bending portion are damaged when a bending type circuit board is formed.

Accordingly, the present embodiment of the invention is intended to form the structure of the circuit board to be thinner while preventing the interconnection lines formed in the bending portion from being damaged.

The first region A is a portion on which the light emitting device 30 is mounted, and the second region B is a portion on which the light emitting device 30 is not mounted, and a portion bent between the first region A and the second region B is called a bending portion 40. Thus, according to the present embodiment of the invention, in the bending portion 40, the interconnection line protection portion 10a may be configured on the periphery of the interconnection line 30b in an intaglio structure.

The circuit board may include a pad line 30a connected to the light emitting device 30 of the first region A.

Figure 2:
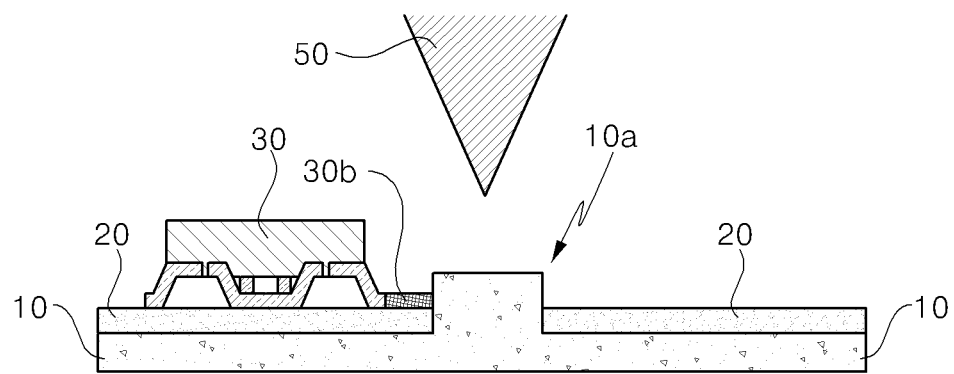
FIGS. 2 and 3 are views illustrating a bending method of the circuit board of FIG. 1 and a cross section taken along lines A-A'.
Figure 3:
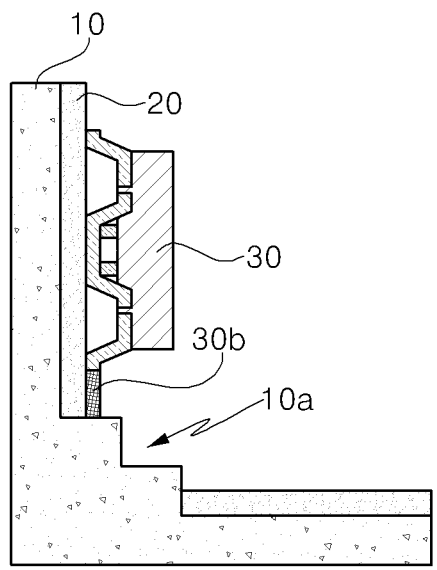

FIGS. 2 and 3 are cross-sectional views illustrating a bending method of the circuit board of FIG. 1 and a cross section taken along lines A-A'.

In the conventional art, since a force is applied when a portion between the first region A and the second region B is bent, there is generated a case in which lines formed in the bending portion 40 are damaged.

To solve the problem, according to the present embodiment of the invention, as illustrated in FIG. 2, the interconnection line protection portion 10a protruding to the periphery of the interconnection line 30b is formed in an embossed structure, and is bent using a bending tool 50, thereby the interconnection line 30b to be prevented from being damaged upon bending as shown in FIG. 3.

At this time, an embossed structure refers to that an element is formed to protrude more than other adjacent elements, and the interconnection line protection portion 10a is formed to protrude in the region in which the interconnection line 30b is not formed so that the support substrate 10 in replacement of the interconnection line 30b can absorb impact when a force is applied to the bending portion 40. The interconnection line protection portion 10a of the embossed structure may be formed in various shapes.

Figure 4:
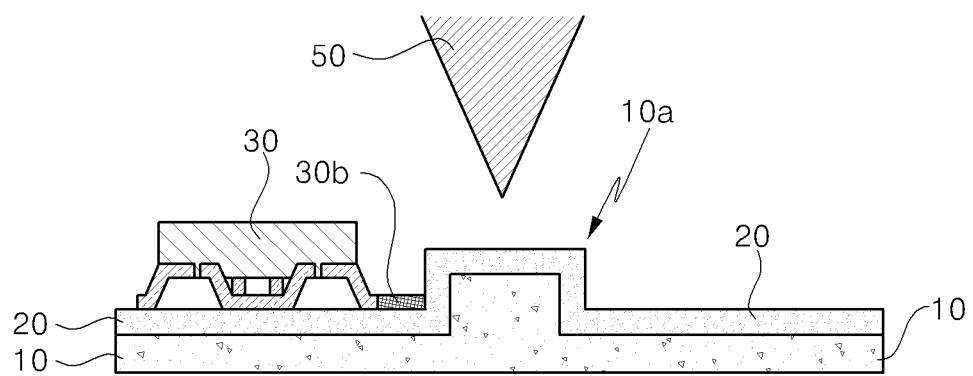
FIGS. 4 and 5 are views illustrating a circuit board according to another embodiment of the present invention.
Figure 5:
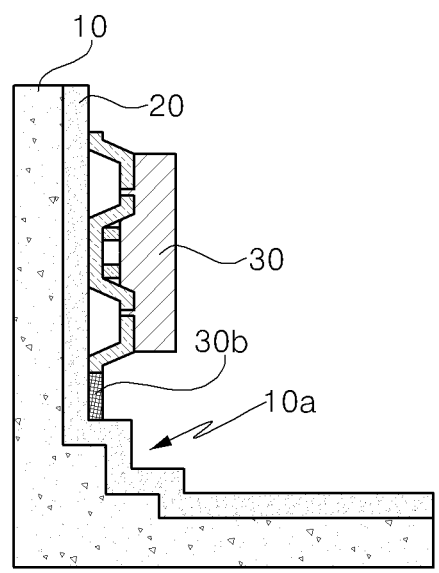

FIGS. 4 and 5 are views illustrating a circuit board according to another embodiment of the present invention.

As illustrated in FIG. 4, the bending portion 40 is configured such that the insulating substrate 20 is formed on the protruding interconnection line protection portion 10a of the support substrate 10 through which the interconnection line 30b does not pass, and bending is performed using a bending tool 50 so that the interconnection line 30b is not damaged upon bending as shown in FIG. 5.

At this time, the interconnection line protection portion 10a may be configured to include at least two edges.

Like the embodiment of FIGS. 2 and 3, in the embodiment of 4 and 5, the interconnection line protection portion 10a is formed on the periphery of the interconnection line 30b so that the support substrate 10 including the interconnection line protection portion 10a in replacement of the interconnection line 30b can absorb impact even though a force is applied to the bending portion 40.

Figure 6:
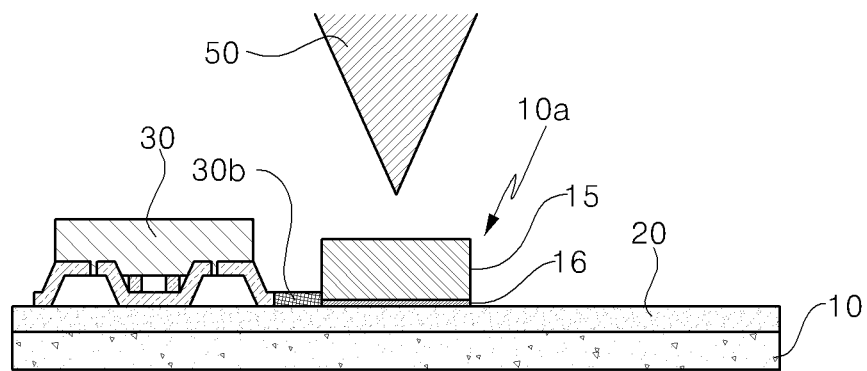
FIGS. 6 and 7 are views illustrating a circuit board according to a further embodiment of the present invention.
Figure 7:
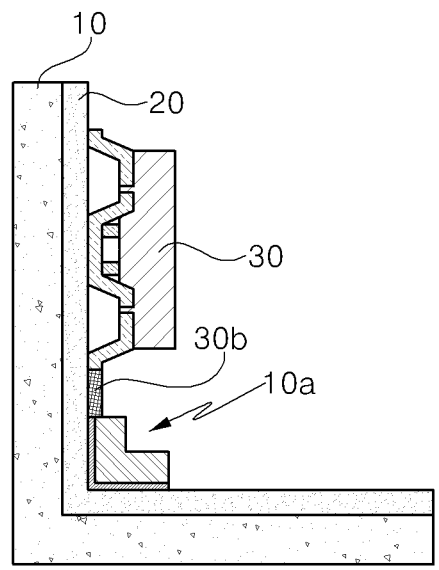

FIGS. 6 and 7 are views illustrating a circuit board according to a further embodiment of the present invention.

As illustrated in FIG. 6, in order to form the interconnection line protection portion 10a on the support substrate 10, a dummy metal 15 is attached to the support substrate 10 using an adhesive layer 16, and bending is performed using the bending tool 50 so that the interconnection line 30b is not damaged upon bending as shown in FIG. 7.

As shown in the embodiment of FIGS. 6 and 7, when the interconnection line protection portion 10a is formed using the dummy metal 15, the interconnection line protection portion 10a may be formed by freely disposing the dummy metal 15 at a desired position, and accordingly, the interconnection line 30b can be effectively protected.

Figure 8:
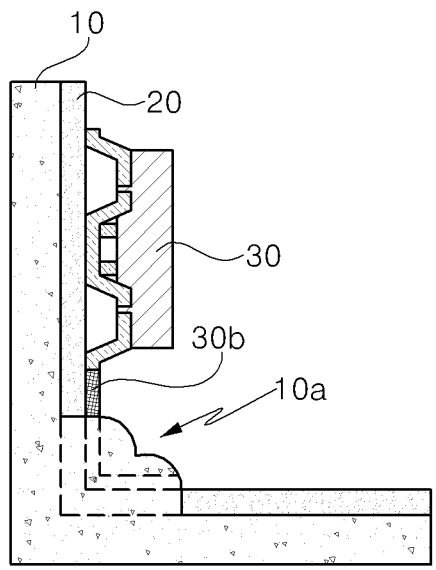
FIGS. 8 and 9 are views illustrating a circuit board according to yet another embodiment of the present invention.
Figure 9:
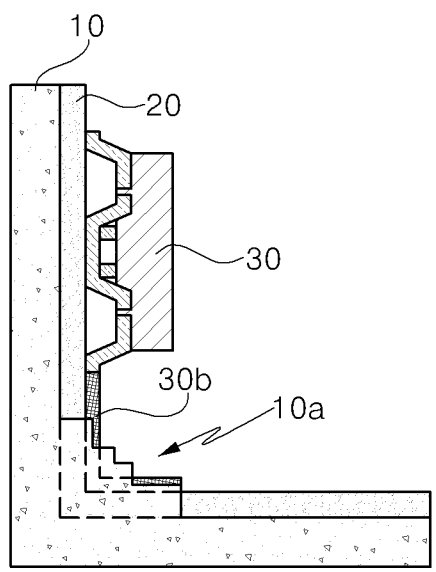

FIGS. 8 and 9 are views illustrating a circuit board according to yet another embodiment of the present invention.

As illustrated in FIG. 8, the interconnection line protection portion 10a arranged on the periphery of the interconnection line 30b may be formed in a curved line.

Alternatively, as illustrated in FIG. 9, the interconnection line protection portion 10a arranged on the periphery of the interconnection line 30b may be configured to have a plurality of stepped portion. That is, as illustrated in FIG. 9, the interconnection line protection portion 10a may be configured in a multiple step type structure.

Figure 10:
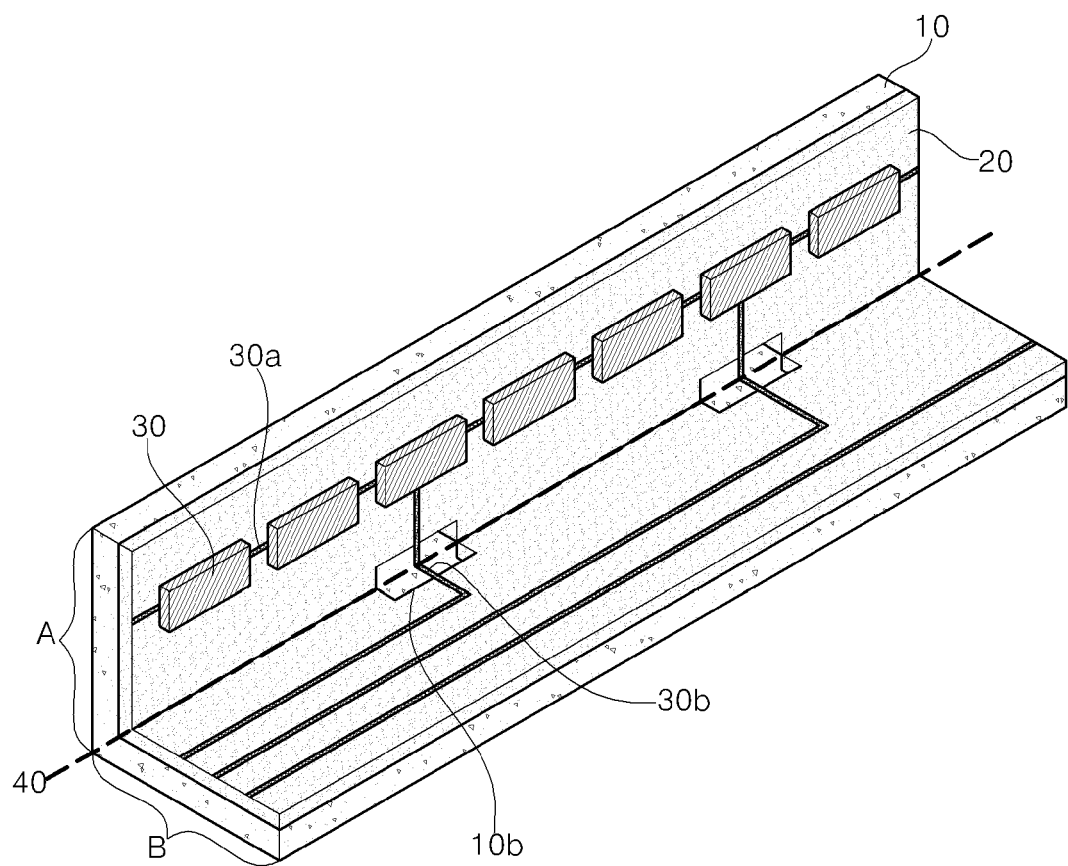
FIG. 10 is a view illustrating a circuit board according to still another embodiment of the present invention.

FIG. 10 is a view illustrating a circuit board according to still another embodiment of the present invention.

Referring to FIG. 10, the circuit board may include: the support substrate 10 including the first region A and the second region extending to be bent from the first region A; the light emitting device 30 mounted in the first region A; the bending portion bent 40 between the first region A and the second region B, wherein the support substrate 10 may be configured such that the interconnection line arrangement portion 10b in a line region in which the interconnection line 30b is included is composed of a bending hole having an intaglio structure. The circuit board 10 may include the insulating substrate 20 on the support substrate 10 and the pad line 30a connected to the light emitting device 30 in the first region A.

The interconnection line arrangement portion 10b in a bending hole form is recessed to be concave more than other adjacent elements. Accordingly, even though a force is applied to the bending portion 40, the interconnection line 30b is pushed to the interconnection line arrangement portion 10b having the intaglio structure of the support substrate 10 so that the interconnection line 30b is not damaged.

Various shapes of the support substrate are not limited to the embodiments as shown in the drawings, the protruding region 10a may be configured in the best shape which enables impact to be relieved.

According to embodiments, the insulating substrate 20 may have an intaglio structure or an embossed structure according to the support substrate 10. For example, the insulating substrate 20 may be configured such that the region in which the interconnection 30b is not formed has an embossed structure and the line region in which the interconnection line 30b is formed has an intaglio structure.

That is, the interconnection line arrangement portion 10b formed in the bending portion 30 may be configured in a bending hole form, and the interconnection line 30b may pass the bending portion 40 via the bending hole. The interconnection line arrangement portion 10b in the bending hole form may be formed to completely pass though the bending portion 40, or may be formed such that a part of the bending portion is concavely recessed as a groove.

Accordingly, when the support substrate 10 having the intaglio structure is formed, the interconnection line arrangement portion 10b in the bending hole form may not be formed separately, may be recessed deeper than the support substrate having the intaglio structure, or may completely pass through the bending portion 40.

Figure 11:
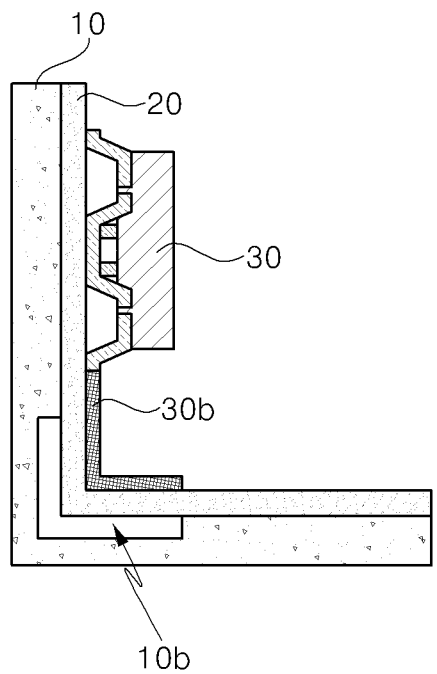
FIG. 11 is a cross-sectional view illustrating a cross section of the circuit board of FIG. 10.

FIG. 11 is a cross-sectional view illustrating a cross section of the circuit board of FIG. 10.

Referring to FIG. 11, in the bending portion 40, the interconnection line arrangement portion 10a having an engraved bending hole structure may be formed in a line region of the support substrate 10 which the interconnection line 30b passes.

More specifically, the interconnection line 30b may be formed on one surface of the insulating substrate 20, and the bending hole 10b may be formed in the support substrate 10 arranged on another surface of the insulating substrate 20.

In this case, even though the bending portion 40 is bent, since the interconnection line arrangement portion 10b is formed as a vacant space in the support substrate 10 of the line region, the interconnection line 30b is not damaged even when impact is applied to the support substrate due to a strength force, and the interconnection line 30b is pushed to the interconnection line arrangement portion 10a having the intaglio structure, thereby enabling the interconnection line to be prevented from being damaged.

Figure 12:
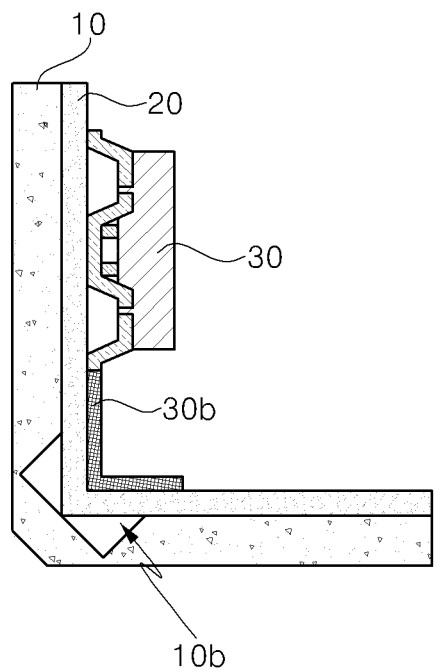
FIGS. 12 and 13 are views illustrating a circuit board according to still further another embodiment of the present invention.
Figure 13:
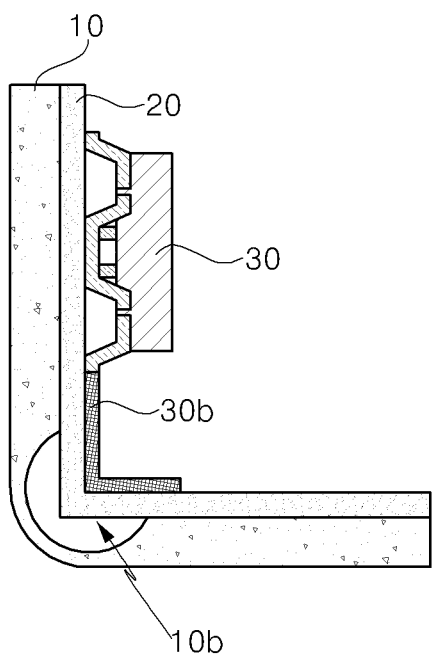

FIGS. 12 and 13 are views illustrating a circuit board according to still further another embodiment of the present invention.

As illustrated in FIG. 12, at least two edges may be formed inside the interconnection line arrangement portion 10a in which the interconnection line 30b is formed, and which has the bending hole form of the support substrate.

Unlike this, as shown in FIG. 13, an inner surface of the interconnection line arrangement portion 10a, in which the interconnection line 30b is formed, and which has the bending hole form of the support substrate, may be formed in a curved shape. The support substrate of the region in which the interconnection line is not formed may have an embossed structure, even though it is not illustrated in the drawing.

As set forth above, according to some embodiments of the present invention, it can be provided with the circuit board which enables the interconnection lines connected to light emitting devices to be prevented from being damaged by including the interconnection line arrangement portion crossing at right angles to the interconnection line for transmitting electrical signals to the light emitting device and the interconnection line protection portion arranged on the periphery of the interconnection lines, and forming the interconnection line protection portion to protrude more than the interconnection line arrangement portion.

Also, according to some embodiments of the present invention, interconnection lines can be prevented from being damaged by forming the bending hole having an intaglio structure in the interconnection line arrangement portion.

Also, according to some embodiments of the present invention, the interconnection line protection portion is configured in a protruding embossed structure so that impact can be absorbed and relieved upon bending.

Also, according to some embodiments of the present invention, the interconnection line arrangement portion having the intaglio structure is configured to include at least two edges at the bottom thereof or is formed in a curved line, or the interconnection line protection portion is formed to have a stepped structure by forming a groove, and thus the support substrate may be formed in various shapes so that the interconnection lines can be prevented from being damaged in advance.

Also, according to some embodiments of the present invention, the dummy metal is attached to the insulating substrate of the support substrate via an adhesive layer, and the bending portion is formed in the dummy metal, so the interconnection line protection portion may be formed by freely disposing the dummy meal at a position where the interconnection lines are needed, thereby enabling the interconnection lines to be protected more effectively.

Also, according to some embodiments of the present invention, it can be provided with a lighting device which is configured such that a circuit board is configured such that a support substrate of a line region in which interconnection lines is included has a stepped structure so that the interconnection lines of the circuit board can be prevented from being damaged, and a structure of the circuit board can be changed to be thinner, and accordingly, when the circuit board is applied to a display device, a bezel width of the display device can be reduced.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A circuit board, comprising:
    a support substrate including a first region and a second region extending to be bent from the first region;
    light emitting devices mounted to the first region of the support substrate; and
    a bending portion bent between the first region and the second region,
    wherein the bending portion comprises: an interconnection line arrangement portion that crosses an interconnection line; and an interconnection line protection portion disposed on the periphery of the interconnection line, and
    wherein the interconnection line protection portion comprises a dummy metal attached to the support substrate using an adhesive layer such that, in a first region not having the interconnection line passing therethrough, the interconnection line protection portion has an embossed structure that is protruded further than the interconnection line arrangement portion in the first region.

2. The circuit board of claim 1, further comprising an insulating substrate formed on the support substrate, wherein the interconnection line protection portion protrudes to an upper part of the insulating substrate.

3. The circuit board of claim 1, further comprising an insulating substrate formed on the support substrate, wherein the interconnection line protection portion is formed on the support substrate to come into contact with the insulating substrate, and the interconnection line arrangement portion is spaced apart from the insulating substrate.

4. The circuit board of claim 1, wherein the interconnection line protection portion comprises at least two edges.

5. The circuit board of claim 1, further comprising an insulating substrate formed on the support substrate, wherein the insulating substrate is formed at a protruding upper part of the interconnection line protection portion.

6. The circuit board of claim 1, wherein the interconnection line protection portion has a curved surface.

7. The circuit board of claim 1, wherein the interconnection line protection portion has a plurality of stepped parts.

8. The circuit board of claim 1, wherein the interconnection line arrangement portion is formed of a bending hole form.

9. The circuit board of claim 8, wherein the bending hole passes through the support substrate on the bending portion.

10. The circuit board of claim 8, further comprising an insulating substrate formed on the support substrate, wherein the interconnection line is formed on one surface of the insulating substrate and the bending hole is formed in the support substrate on another surface of the insulating substrate.

11. The circuit board of claim 8, wherein a cross section of the bending hole comprises at least two edges at a bottom.

12. The circuit board of claim 8, wherein a cross section of the bending hole is formed in a curved line.

13. A lighting device, comprising:
    the circuit board of claim 1; and
    a light guide plate disposed to be spaced apart from the circuit board.

* * * * *